RESIN-SEALED SEMICONDUCTOR DEVICE AND MANUFACTURING METHOD FOR THE SAME
Filed June 9, 1967

Shintaro Ito
Koichi Suzuki
INVENTORS
Kemon, Palmer,
Stewart + Estabrook 3,492,157

RESIN-SEALED SEMICONDUCTOR DEVICE AND MANUFACTURING METHOD FOR THE SAME

Shintaro Ito, Tokyo, and Koichi Suzuki, Yokohama-shi, Japan, assignors to Tokyo Shibaura Electric Co., Ltd., Kawasaki-shi, Japan, a corporation of Japan Filed June 9, 1967, Ser. No. 644,867
Claims priority, application Japan, June 20, 1966, 41/39,551
Int. Cl. H01l *3/00, 5/00;* B44d *1/14*
U.S. Cl. 117—218 21 Claims

ABSTRACT OF THE DISCLOSURE

Semiconductor devices are formed by applying a first resin of great adhesivity directly to the surface of a semiconductor element and then a second resin having excellent properties of thermal conductivity and expansion in a manner to cover said first resin, thereby sealing said semiconductor element. A filler is included in the second resin layer in an amount of at least 50% by weight of the resin.

BACKGROUND OF THE INVENTION

The present invention relates to a semiconductor device and a manufacturing method for the same, more particularly to a resin-sealed semiconductor device and a manufacturing method for the same. The semiconductor element of which the transistor or diode is composed should be kept completely free from moisture or open air, and common practice to this end is to seal said semiconductor element in an outer metal vessel in an airtight manner. However, due to recent demand for the compactness of the subject apparatus and the simplification of its manufacturing process, a method of burying a semiconductor element entirely within a resin sealant instead of using an outer metal vessel has come into use and attained the aforesaid shielding effect.

To explain, for instance, the resin-sealed transistor in common use comprises a silicon element having an emitter region, base region and collector region formed therein, interior lead wires extending from the prescribed regions of said element and a single epoxy resin layer which contains outer lead wires having a larger diameter than said interior lead wires and in which are buried for protection the aforesaid element, the whole of the interior lead wires and part of the outer lead wires.

However, the resin used in the aforementioned type of resin-sealed semiconductor device is required to meet various requirements, for example, that it should have excellent thermal conductivity so as to improve and stabilize the properties of the semiconductor device, that it should have good adhesivity to the component parts of said device such, for example, as the lead wires and semiconductor element, that it should have a thermal expansion coefficient approximating those of said component parts and also that it should not release harmful substances.

To date, however, no resin has been developed which can meet all the aforementioned requirements. The previous difficulties were, for example, that if the resin used had good adhesivity to the component parts it did not meet requirements for thermal expansion coefficient and thermal conductivity, whereas the resin having excellent properties of thermal conductivity and expansion was not satisfactory in other respects.

SUMMARY OF THE INVENTION

In view of the drawbacks of the commonly used semiconductor device, the present invention has been accomplished in order to offer a resin-sealed semiconductor device having an improved construction.

Another object of the present invention is to offer a semiconductor device wherein said semiconductor is sealed in a resinous material which has been improved in the properties of thermal expansion and conductivity without reducing its adhesivity to the component parts of said device.

Still another object of the present invention is to offer a resin-sealed semiconductor device improved by the use of two types of resin having different properties.

Namely, the present invention carries out the sealing of a semiconductor element assembly by first coating the component parts of the subject device such, for example, as the lead wires with a first resin layer having good adhesivity thereto to a thickness of 10 to 100 microns and then applying a second resin layer having satisfactory properties of the thermal conductivity and expansion to said first resin layer prior to the completion of its hardening reaction, and thereafter hardening both first and second resins to form a continuous intermediate layer in the interface between these resins instead of a discontinuous joint, thereby improving the properties of the semiconductor device.

As described above, where a first resin of great adhesivity is applied on the surface of the component parts of the semiconductor element assembly according to the process of the present invention, it is necessary to coat said first resin to a thickness of at least 10 to 100 microns. Since the application of the second resin is made prior to the hardening of the first resin, if the thickness of said first resin is less than 10 microns, there will exist no layers consisting of the first resin alone due to the fusion of these two resins, with the result that the second resin directly contacts the surface of the component parts of the apparatus, thus reducing the adhesivity of the resin element as a whole.

Since the first resin is selected with main emphasis on the improvement of adhesivity of the resin element, but without particular considerations to assure the thermal conductivity and expansion thereof, if said first resin is applied to a thickness of more than 100 microns, there will appear too great difference between the thermal expansion coefficient of said first resin and these portions of the component parts of the line which come in contact therewith, so that the heat released from the semiconductor device during its operation will not conducted satisfactorily and its output will be reduced due to increased heat resistance.

The integration of the first and second resins by the formation of a continuous intermediate layer may be carried out, for example, by the hardening reaction between the hardening agent of the first resin and the second resin or that between the hardening agent of the second resin and the first resin or the mutual hardening reaction between these two resins. The only requirement for this purpose is that the first and second resins have the same type of reactive group, e.g., 1,2-epoxy group, and the class of resins generally referred to as epoxy resins are preferred.

As mentioned above, in the resin-sealed semiconductor device under the present invention, the first resin layer of great adhesivity and the second resin layer whose thermal expansion coefficient approximates that of the semiconductor element constitute a continuous integrated body without forming a discontinuous joint, so that they are free from failures such, for example, as peeling off due to thermal or mechanical causes. Thus it has become possible to obtain a resin-sealed semiconductor device whose properties have been improved and stabilized to an extent not realizable by the prior art.

Further description will hereinafter be given of the present invention with reference to the attached drawings.

DESCRIPTION OF THE PREFERRED EMBODIMENTS

Figure 1:
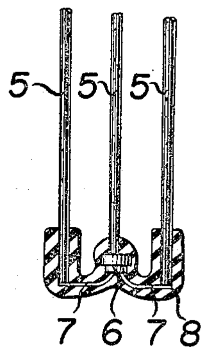
FIGS. 1 to 3 are cross sectional and slantwise views illustrating the process of manufacturing a resin-sealed transistor device according to the present invention.

First, as shown in FIG. 1, a silicon transistor element 6 is soldered to the end of the middle one of three outer lead wires 5 having a relatively large diameter, and from said element 6 are extended interior lead wires 7 having a smaller diameter than said outer lead wires to be connected with the remaining two of the aforesaid outer lead wires 5. Within said silicon transistor element 6 are formed a collector region, base region and emitter region (not shown) so as to form a transistor construction. The surface of the assembled part on which said silicon transistor element 6 is to be mounted is coated with layers 8 of the first epoxy resin of good adhesivity and having the following composition to a thickness of 90 microns:

| | | |
|---|---|---|
| Epicoat #828 (trade name) | g | 50 |
| Methyl nadic anhydride (hardening agent) | g | 40 |
| Benzyldimethylamine (hardening promoter) | cc | 0.2 |
| Acetone (solvent) | g | 30 |

The "Epicoat #828" used in the resin composition is a well known, commercially available 1,2-epoxide resin made by reaction of bisphenol A and epichlorohydrin in the presence of sodium hydroxide (see U.S. 2,863,853).

Figure 2:
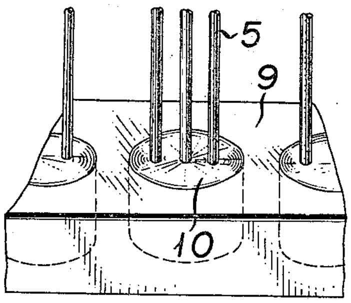
Figure 3:
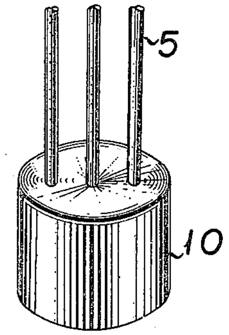

Then said first resin layer is dried to the extent that the hardening reaction does not take place. Prior to the solidification of this first resin, the semiconductor element assembly is immersed, as shown in FIG. 2, in second epoxy resin 10 of good thermal expansion and conductivity filled into mold 9 which is made of tetrafluoroethylene polymer so as to harden the first and second resins at the same time. Thus a continuous intermediate layer is formed between these resins without a discontinuous joint. Upon completion of the hardening of these resins, a resin-sealed transistor is completed as shown in FIG. 3.

The second resin having good properties of thermal expansion and conductivity should preferably be prepared by mixing the epoxy resin used as said first resin and powders of an inorganic oxide, e.g. titanium oxide, zirconium oxide, silica, alumina or iron oxide singly or in combination in the ratio of 1:1 or 1:2. Addition of such powders may reduce the adhesivity of the resin, but will bring the thermal expansion coefficient of said resin closer to that of a semiconductor than when said epoxy resin alone is used.

Although silicon has a thermal expansion coefficient of $4.2 \times 10^{-6}$ 1/° C., addition of various fillers to Epicoat #828 (trade name) will lhange the thermal expansion coefficient of the resin having the aforementioned composition to the values given below.

| Filler: | Thermal Expansion Coefficient (1/° C.) |
|---|---|
| Ferric oxide ($Fe_2O_3$) | $36 \times 10^{-6}$ |
| Aluminum oxide ($Al_2O_3$) | $25 \times 10^{-6}$ |
| Silicon dioxide ($SiO_2$) | $27 \times 10^{-6}$ |

However, where no filler is added, said resin has a thermal expansion coefficient of $53 \times 10^{-6}$ 1/° C. The above values of the thermal expansion coefficient represent the case where the fillers were added to the resin to the extent of 70 percent by weight. Instead of abovementioned metal oxide it is possible to use a nitride, for example, silicon nitride ($Si_3N_4$), and a carbide, for example, silicon carbide (SiC) as fillers. It has been disclosed that addition of any or combination of the above fillers reduced the thermal expansion coefficient of the resin to a point approximating that of a semiconductor material. Furthermore addition of these fillers improved not only the thermal expansion, but also thermal conductivity of the resin. This is particularly useful where such filler-incorporated resin is used in a semiconductor apparatus which releases heat during operation. With respect to the adhesive power, however, addition of more than 50 percent of fillers will reduce the shearing tensile strength and consequently adhesive power of the resin.

Therefore according to the present invention, the first resin to be used in direct contact with the assembled parts should be applied without any filler or with addition thereof to an extent of at least less than 50 percent and also to a thickness of 10 to 100 microns.

While the invention has been described in connection with some preferred embodiments thereof, the invention is not limited thereto and includes any modifications and alternations which fall within the true spirit and scope of the invention.

What is claimed is:

1. In a resin-sealed semiconductor device which comprises a semiconductor element, a first layer of epoxy resin of good adhesivity applied to the surface of said element in a thickness between 10 and 100 microns and a second resin layer coated on said first layer, said second resin layer comprising an epoxy resin and at least 50 percent by weight on the basis of said resin of an inorganic filler whereby the thermal expansion coefficient of said second layer is closer to that of said element than said first layer, the union between said first and second layers being devoid of any discontinuity.

2. The semiconductor device claimed in claim 1 wherein said second epoxy resin layer contains powdered inorganic oxide.

3. The semiconductor device claimed in claim 1 wherein said second epoxy resin layer contains powdered silicon nitride.

4. The semiconductor device claimed in claim 1 wherein said second epoxy resin layer contains powdered silicon carbide.

5. The semiconductor device claimed in claim 1 wherein the weight ratio of said filler to epoxy resin in said second layer is between 1:1 and 2:1.

6. The semiconductor device claimed in claim 1 wherein said filler is powdered iron oxide.

7. The semiconductor device claimed in claim 1 wherein said filler is powdered aluminum oxide.

8. The semiconductor device claimed in claim 1 wherein said filler is powdered silicon oxide.

9. The semiconductor device claimed in claim 1 wherein said filler is powdered titanium oxide.

10. The semiconductor device claimed in claim 1 wherein said filler is powdered zirconium oxide.

11. In a method of manufacturing a resin-sealed semiconductor device, the improvement which comprises applying to a semiconductor element a first resin layer of epoxy resin of good adhesivity to said element in a thickness between 10 and 100 microns, applying over said first layer prior to its hardening a second resin layer, said second resin layer comprising an epoxy resin and at least 50 percent by weight on the basis of the resin of an inorganic filler whereby said second resin layer has a thermal expansion coefficient closer to said element than said first resin layer and then simultaneously hardening said first and second layers thereby forming a union between them devoid of any discontinuity.

12. A method as claimed in claim 11 wherein the epoxy resin of said first layer is the same as the epoxy resin of said second layer.

13. The method for manufacturing a semiconductor device claimed in claim 11 wherein the filler in said second epoxy resin is powdered silicon carbide.

14. The method for manufacturing a semiconductor device claimed in claim 11 wherein the filler in said second epoxy resin is powered silicon nitride.

15. The method for manufacturing a semiconductor device claimed in claim 11 wherein the filler in said second epoxy resin layer is an inorganic oxide.

16. The method for manufacturing a semiconductor device claimed in claim 15 wherein said inorganic oxide is iron oxide.

17. The method of manufacture of a semiconductor device claimed in claim 11 wherein said filler is aluminum oxide.

18. The method of manufacture of a semiconductor device claimed in claim 11 wherein said filler is silicon oxide.

19. The method of manufacture of a semiconductor device claimed in claim 11 wherein said filler is titanium oxide.

20. The method of manufacture of a semiconductor device claimed in claim 11 wherein said filler is zirconium oxide.

21. The method of manufacture of a semiconductor device claimed in claim 11 wherein said filler is present in said layer in a weight ratio of resin to filler between 1:1 and 1:2.

References Cited

UNITED STATES PATENTS

| | | | |
|---|---|---|---|
| 2,937,110 | 5/1960 | John | 117—218 X |
| 2,940,161 | 6/1960 | Elarde | 117—218 |
| 3,135,625 | 6/1964 | Ingrassia | 117—62.2 |
| 3,156,580 | 11/1964 | Howard | 117—62.2 X |
| 3,235,937 | 2/1966 | Lanzl et al. | 29—588 X |
| 3,240,619 | 3/1966 | Winchester | 117—62.2 X |
| 3,278,813 | 10/1966 | Fahey | 29—588 X |
| 3,283,224 | 11/1966 | Erkan | 29—588 X |
| 3,298,087 | 1/1967 | Hunt | 29—588 |

WILLIAM D. MARTIN, Primary Examiner

RALPH HUSACK, Assistant Examiner

U.S. Cl. X.R.

29—588; 117—221, 62.2; 317—234